(12) United States Patent
Takahashi et al.

(10) Patent No.: US 9,559,221 B2
(45) Date of Patent: Jan. 31, 2017

(54) SOLAR CELL PRODUCTION METHOD, AND SOLAR CELL PRODUCED BY SAME PRODUCTION METHOD

(71) Applicant: SHIN-ETSU CHEMICAL CO., LTD., Tokyo (JP)

(72) Inventors: Mitsuhito Takahashi, Annaka (JP); Takenori Watabe, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/417,330

(22) PCT Filed: Jul. 30, 2013

(86) PCT No.: PCT/JP2013/070564
§ 371 (c)(1),
(2) Date: Jan. 26, 2015

(87) PCT Pub. No.: WO2014/024729
PCT Pub. Date: Feb. 13, 2014

(65) Prior Publication Data
US 2015/0206990 A1      Jul. 23, 2015

(30) Foreign Application Priority Data
Aug. 9, 2012  (JP) .................. 2012-176907

(51) Int. Cl.
*H01L 31/18*  (2006.01)
*H01L 31/0216*  (2014.01)
(Continued)

(52) U.S. Cl.
CPC ....... *H01L 31/02168* (2013.01); *C23C 16/452* (2013.01); *C23C 16/50* (2013.01);
(Continued)

(58) Field of Classification Search
CPC ............. H01L 1/02168; H01L 31/1868; H01L 31/206; H01L 21/0217; H01L 21/02274
See application file for complete search history.

(56) References Cited

U.S. PATENT DOCUMENTS 6,265,288 B1 * 7/2001 Okamoto .............. H01L 31/075 136/255
2009/0007966 A1   1/2009 Isaka et al.
(Continued)

FOREIGN PATENT DOCUMENTS

EP   0 704 559 A1   4/1996
EP   1 816 683 A1   8/2007
(Continued)

OTHER PUBLICATIONS

International Search Report dated Nov. 19, 2013, issued in corresponding application No. PCT/JP2013/070564.
(Continued)

Primary Examiner — Earl Taylor
(74) Attorney, Agent, or Firm — Westerman, Hattori, Daniels & Adrian, LLP (57) ABSTRACT

This solar cell production method involves productively forming an antireflection film comprising silicon nitride, said antireflection film having an excellent passivation effect. In an embodiment, a remote plasma CVD is used to form a first silicon nitride film on a semiconductor substrate (102) using the plasma flow from a first plasma chamber (111), then to form a second silicon nitride film, which has a different composition than the first silicon nitride film, using the plasma flow from a second plasma chamber (112), into which ammonia gas and silane gas have been introduced at a different flow ratio than that of the first plasma chamber (111). The plasma chambers (111, 112) have excitation parts (111a, 112a) that excite the ammonia gas, and
(Continued)

activation reaction parts (111*b*, 112*b*) and a flow controller (113).

11 Claims, 4 Drawing Sheets

(51) Int. Cl.
*H01L 31/068* (2012.01)
*C23C 16/452* (2006.01)
*C23C 16/50* (2006.01)
*C23C 16/52* (2006.01)

(52) U.S. Cl.
CPC ........ *C23C 16/52* (2013.01); *H01L 31/02167* (2013.01); *H01L 31/068* (2013.01); *H01L 31/1804* (2013.01); *Y02E 10/547* (2013.01); *Y02P 70/521* (2015.11)

(56) References Cited

U.S. PATENT DOCUMENTS

| | | | | |
|---|---|---|---|---|
| 2011/0245957 | A1* | 10/2011 | Porthouse | H01L 21/67109 700/114 |
| 2011/0262641 | A1* | 10/2011 | Sferlazzo | C23C 16/4412 427/255.28 |
| 2011/0272008 | A1* | 11/2011 | Mungekar | H01L 31/02168 136/252 |
| 2011/0272024 | A1* | 11/2011 | Choi | H01L 31/02168 136/259 |
| 2012/0164784 | A1* | 6/2012 | Feldman-Peabody | H01J 37/32899 438/84 |
| 2013/0171757 | A1* | 7/2013 | Ponnekanti | H01L 31/18 438/57 |
| 2013/0186464 | A1* | 7/2013 | Sheng | H01L 31/068 136/256 |
| 2013/0247974 | A1* | 9/2013 | Moriyama | H01L 31/02363 136/256 |
| 2014/0174532 | A1* | 6/2014 | Stewart | H01L 31/18 136/259 |
| 2015/0206990 | A1* | 7/2015 | Takahashi | H01L 31/02167 136/256 |

FOREIGN PATENT DOCUMENTS

| | | |
|---|---|---|
| JP | 8-73297 A | 3/1996 |
| JP | 2002-270879 A | 9/2002 |
| JP | 2003-273034 A | 9/2003 |
| JP | 2005-217220 A | 8/2005 |
| JP | 2008-10746 A | 1/2008 |
| JP | 2009-117569 A | 5/2009 |
| JP | 2009-130041 A | 6/2009 |
| WO | 20121036002 A1 | 3/2012 |

OTHER PUBLICATIONS

Extended Search Report dated Jan. 11, 2016, issued in European Application No. 13828718.0 (8 pages).

* cited by examiner

SOLAR CELL PRODUCTION METHOD, AND SOLAR CELL PRODUCED BY SAME PRODUCTION METHOD

TECHNICAL FIELD

This invention relates to a method for producing a solar cell using a remote plasma-enhanced chemical vapor deposition (CVD) apparatus, and a solar cell produced by the method.

BACKGROUND ART

The solar cell is a semiconductor device for converting light energy to electricity and includes p-n junction type, pin type and Schottky type, with the p-n junction type being on widespread use. When classified in terms of substrate material, the solar cell is generally classified into three categories, crystalline silicon solar cells, amorphous silicon solar cells, and compound semiconductor solar cells. The crystalline silicon solar cells are sub-divided into monocrystalline and polycrystalline solar cells. Since crystalline silicon substrates for solar cells can be relatively easily manufactured, the crystalline silicon solar cells are currently manufactured at the largest scale and will find further widespread use in the future. See JP-A H08-073297 (Patent Document 1), for example.

In general, output characteristics of a solar cell are evaluated by measuring an output current-voltage curve by means of a solar simulator. On the curve, the point where the product of output current $I_{max}$ by output voltage $V_{max}$, $I_{max} \times V_{max}$, becomes the maximum is designated maximum power point $P_{max}$. The conversion efficiency η of the solar cell is defined as the maximum power point $P_{max}$ divided by the overall light energy (S×I) incident on the solar cell:

$$\eta = \{P_{max}/(S \times I)\} \times 100(\%)$$

wherein S is a cell area and I is the intensity of irradiated light.

For increasing the conversion efficiency η, it is important to increase short-circuit current $I_{sc}$ (output current value at V=0 on the current-voltage curve) or $V_{oc}$ (output voltage value at I=0 on the current-voltage curve) and to make the profile of output current-voltage curve as close to squareness as possible. It is noted that the degree of squareness of an output current-voltage curve is generally evaluated by the fill factor (FF) which is defined as:

$$FF = P_{max}/(I_{sc} \times V_{oc}).$$

As the value of FF is closer to unity (1), the output current-voltage curve approaches ideal squareness, indicating an increase of conversion efficiency η.

For increasing the conversion efficiency η, it is important to reduce the surface recombination of carriers. In the crystalline silicon solar cell, minority carriers photo-generated by incidence of sunlight reach the p-n junction mainly via diffusion before they are externally extracted as majority carriers from electrodes attached to the light-receiving surface and back surface to provide electric energy.

At this point, those carriers which may be otherwise withdrawn as current flow can be lost by recombination via the interfacial level available on the substrate surface other than the electrode surface, leading to a lowering of conversion efficiency η.

Thus, in high-efficiency solar cells, an attempt to improve conversion efficiency η is by protecting the light-receiving and back surfaces of a silicon substrate with insulating films except for areas in contact with electrodes, for thereby restraining carrier recombination at the interface between the silicon substrate and the insulating film. As the insulating film, a silicon nitride film is useful and used in practice. This is because the silicon nitride film has the function of an antireflective film for crystalline silicon solar cells and is fully effective for the passivation of the surface and interior of the silicon substrate.

Figure 1:
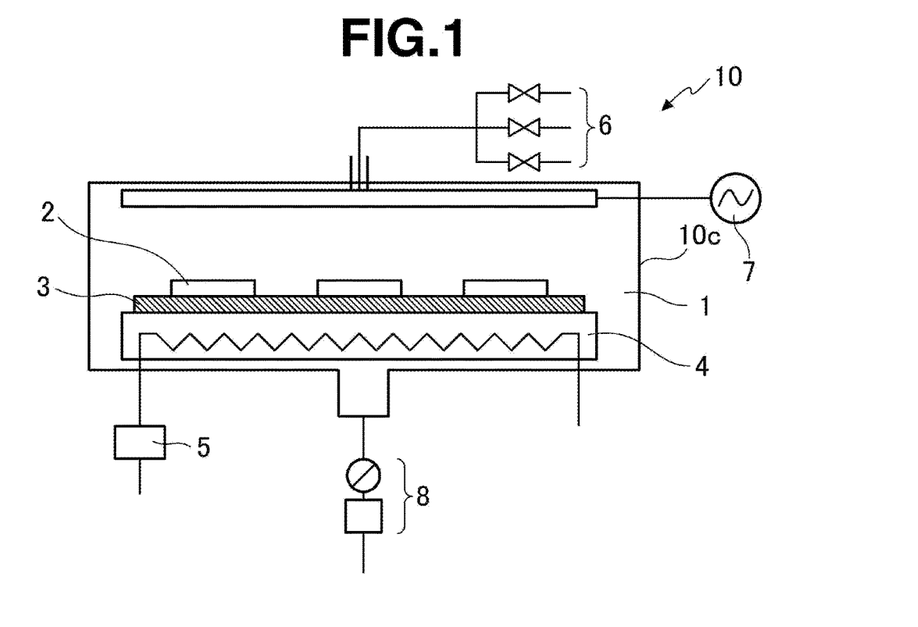
FIG. 1 is a schematic view illustrating one exemplary parallel plate type plasma-enhanced CVD apparatus.

In the prior art, the silicon nitride film is formed by chemical vapor deposition (CVD) processes such as thermal CVD, plasma-enhanced CVD, and catalytic CVD. Of these, the plasma-enhanced CVD is the most widespread process. FIG. 1 schematically illustrates a parallel plate type plasma-enhanced CVD apparatus which is generally known as direct plasma CVD. The CVD apparatus 10 in FIG. 1 includes a vacuum chamber 10c defining a deposition compartment 1. Disposed in the deposition compartment 1 are a tray 3 for resting a semiconductor substrate 2 in place, a heater block 4 for maintaining the tray 3 at a predetermined temperature, and a temperature controller 5 for controlling the temperature of the heater block 4. The deposition compartment 1 is also provided with a deposition gas inlet line 6 for introducing preselected deposition gas as reactant gas into the deposition compartment 1, a radio-frequency power supply 7 for supplying energy to the introduced gas to generate a plasma, and a pumping unit 8.

When an insulating film is deposited in the illustrated CVD apparatus, the preselected deposition gas is introduced into the deposition compartment 1 at the predetermined flow rate through the gas inlet line 6, and the radio-frequency power supply 7 is operated to create a radio-frequency electric field. This operation generates a radio-frequency discharge to excite the deposition gas into a plasma, whereupon an insulating film is deposited on the surface of semiconductor substrate 2 via plasma-induced reaction. For example, when a silicon nitride film is deposited, a mixture of silane and ammonia gases is introduced as the deposition gas into the deposition compartment 1 through the gas inlet line 6, whereupon a silicon nitride film is deposited utilizing decomposition reaction of silane in plasma.

The plasma-enhanced CVD process is often used in forming an insulating film for solar cells since a high deposition rate is achievable even when the process temperature is as low as about 400° C. However, since high-energy charged particles created in the plasma tend to cause damage to the film being deposited and the silicon substrate surface, the resulting silicon nitride film has a higher interfacial level density, failing to exert a satisfactory passivation effect. Thus, for improving the passivation effect, it is necessary to block a dangling bond with hydrogen or the like.

Figure 2:
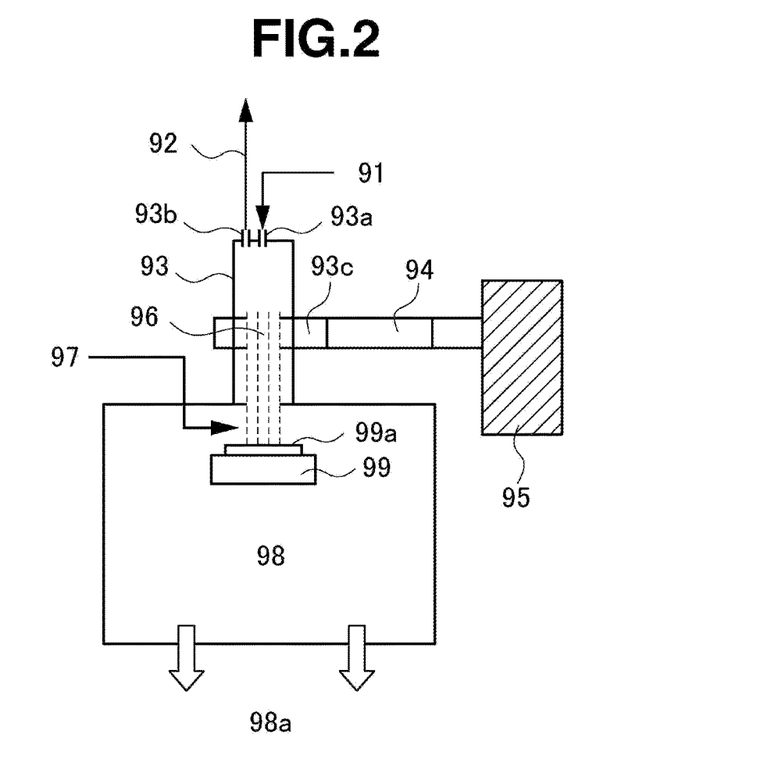
FIG. 2 is a schematic view illustrating one exemplary prior art remote plasma-enhanced CVD apparatus.

To address the above problem, for example, JP-A 2005-217220 (Patent Document 2) proposes a remote plasma-enhanced CVD process as the method capable of suppressing plasma damage. FIG. 2 schematically illustrates one exemplary apparatus. The remote plasma-enhanced CVD apparatus shown in FIG. 2 includes a cylindrical excitation compartment 93 for exciting a reactant gas introduced therein into plasma, and a reaction compartment (or treating compartment) 98 disposed below the excitation compartment 93 in fluid communication therewith. The excitation compartment 93 is provided at its top with an inlet port 93a for a carrier gas 91, and at its center with a radio-frequency introducing portion (or waveguide) 93c which is connected to a microwave power source 95 via a matching unit 94. A supply line for a reactant gas 97 for deposition is connected to the reaction compartment 98, and a substrate holder 99 for holding a substrate 99a is disposed in the reaction compartment 98. With the apparatus of such construction, first microwave is introduced into the excitation compartment 93 from the microwave power source 95 to excite the carrier gas 91, the excited carrier gas 91 is introduced into the reaction compartment 98 in accordance with a gas pumping stream, and the reactant gas 97 is introduced in the reaction compartment 98 where it is activated and contacted with the substrate 99a, whereby a film is formed on the substrate 99a. Using ammonia gas as the carrier gas 91 and silane gas as the reactant gas 97, for example, a silicon nitride film can be formed on the substrate 99a. Since the remote plasma-enhanced CVD apparatus is constructed such that the substrate is placed at a position remote from the plasma region 96, the plasma damage to the substrate may be mitigated to some extent.

Also, JP-A 2009-117569 (Patent Document 3) reports that the passivation effect is improved when plasma treatment using ammonia gas is carried out as pretreatment, prior to the deposition of a silicon nitride film by surface wave plasma. JP-A 2009-130041 (Patent Document 4) reports that the passivation effect is improved when treatment with a plasma generated using a gas mixture of hydrogen gas and ammonia gas is carried out, prior to the deposition of a silicon nitride film.

However, since the above-cited methods need an extra process separate from the insulating film forming process, there arise the problems of an increased production cost and difficulty to improve productivity.

Further, if the composition of a silicon nitride film formed by the plasma-enhanced CVD is shifted from the stoichiometry to a silicon rich side so as to form a positive fixed charge, band bending occurs. Near the contact interface between silicon substrate and silicon nitride film, an inversion layer in which electrons are rich on the silicon substrate side is formed. Utilizing this, the passivation effect on the n-type region side can be enhanced.

JP-A 2002-270879 (Patent Document 5) reports that conversion efficiency is improved by a two-layer structure which is constructed by forming a silicon nitride layer having a high refractive index as a first dielectric film, and then forming a silicon nitride layer having a low refractive index thereon as a second dielectric film. This method, however, needs separate processes for forming high and low refractive index silicon nitride layers. For example, a silicon nitride layer having a high refractive index is first formed, after which the flow rate of deposition gas, after which a ratio of flow rates of ammonia gas and silane gas is adjusted, and then a silicon nitride layer having a low refractive index is formed. The method results in an increase of production cost and is difficult to improve productivity.

SUMMARY OF INVENTION

Technical Problem

An object of the invention, which is made under the above circumstances, is to provide a method for producing a solar cell in which an antireflective film of silicon nitride having an improved passivation effect is formed at high productivity, and a solar cell produced by the method.

Solution to Problem

Making extensive investigations to attain the above object, the inventors have found that when layers are successively deposited on a semiconductor substrate in a remote plasma-enhanced CVD apparatus, by using ammonia and silane gases as the deposition gas, providing a plasma flow from a first plasma compartment, and providing a plasma flow from a second plasma compartment having a different flow rate ratio of ammonia gas and silane gas than in the first plasma compartment, a silicon nitride film constructed of at least two layers of different compositions is completed, an inversion layer in which electrons are rich on the semiconductor substrate side is formed near the contact interface between the semiconductor substrate and the silicon nitride film, the plasma damage to the substrate is mitigated, and the passivation effect is improved. The invention is predicated on this finding.

Accordingly, the present invention provides a method for producing a solar cell and a solar cell, as defined below.

[1] A method for producing a solar cell comprising the step of forming an antireflective film composed of silicon nitride on a surface of a semiconductor substrate, using a remote plasma-enhanced CVD apparatus, characterized in that said remote plasma-enhanced CVD apparatus includes a deposition compartment where the semiconductor substrate is conveyably placed, a plurality of plasma compartments disposed above the deposition compartment in fluid communication therewith, each adapted to generate a plasma flow of ammonia gas, to introduce silane gas into the plasma flow, and to inject the plasma flow toward the deposition compartment, and a flow controller coupled with the plasma compartments for controlling a flow rate ratio of ammonia gas to silane gas introduced into each plasma compartment, a first silicon nitride layer is deposited on the semiconductor substrate from a plasma flow from a first plasma compartment, and as the substrate is conveyed to below a second plasma compartment, a second silicon nitride layer of a different composition than the first silicon nitride layer is deposited from a plasma flow having a different flow rate ratio of ammonia gas to silane gas than in the first plasma compartment.

[2] The solar cell production method of [1] wherein the flow rate ratio of ammonia gas to silane gas (ammonia gas flow rate/silane gas flow rate) in the first plasma compartment is 0.1 to 1.0.

[3] The solar cell production method of [2] wherein the flow rate ratio of ammonia gas to silane gas (ammonia gas flow rate/silane gas flow rate) in the second plasma compartment is 1.5 to 3.0.

[4] The solar cell production method of any one of [1] to [3] wherein the semiconductor substrate is a silicon substrate of one conductivity type having a diffusion layer of opposite conductivity type formed on a substrate surface that is assigned to a light-receiving surface, and the antireflective film is formed on the diffusion layer.

[5] The solar cell production method of any one of [1] to [4] wherein the semiconductor substrate is a silicon substrate of one conductivity type having a diffusion layer of one conductivity type formed on at least a portion of a substrate surface that is assigned to a surface remote from a light-receiving surface, and the antireflective film is formed on the diffusion layer-bearing surface.

[6] A solar cell produced by the method of any one of [1] to [5].

Advantageous Effects of Invention

Since a silicon nitride film of two-layer structure is formed by the remote plasma-enhanced CVD process according to the invention, an antireflective film having improved passivation effect is available. Since in each of two plasma compartments, a layer is continuously deposited at a fixed ratio of flow rates of ammonia gas and silane gas, a silicon nitride film of two-layer structure having the predetermined compositional ratio can be formed in a consistent manner while the productivity of solar cells is improved.

BRIEF DESCRIPTION OF DRAWINGS

FIG. 3 is a schematic view illustrating a solar cell producing method in one embodiment of the invention; (A) showing a substrate, (B) showing an n-type diffusion layer formed on substrate back surface, (C) showing a p-type diffusion layer formed on substrate front surface, (D) showing antireflective films (silicon nitride films) formed on substrate front and back surfaces, (E) showing finger electrode and back electrode formed, and (F) showing bus bar electrode formed.

FIG. 4 is a schematic view illustrating a solar cell producing method in another embodiment of the invention; (A) showing a substrate, (B) showing an n-type diffusion layer formed on substrate front surface, (C) showing an antireflective film (silicon nitride film) formed on substrate front surface, and (D) showing finger electrode, back electrode, and bus bar electrode formed.

DESCRIPTION OF EMBODIMENTS

Now the solar cell producing method of the invention is described with reference to the drawings although the invention is not limited thereto.

FIGS. 3 and 4 are schematic views illustrating the solar cell producing method in embodiments of the invention. The steps are described below in detail.

(1) Substrate

Figure 3A:
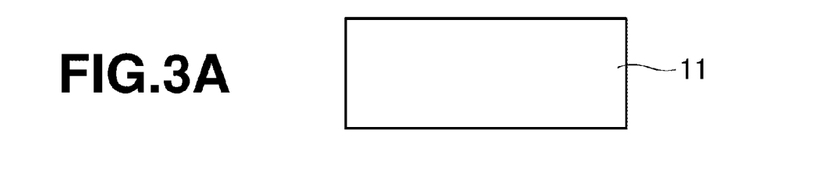
Figure 3B:
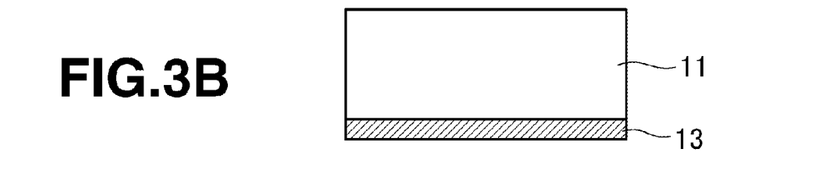
Figure 3C:
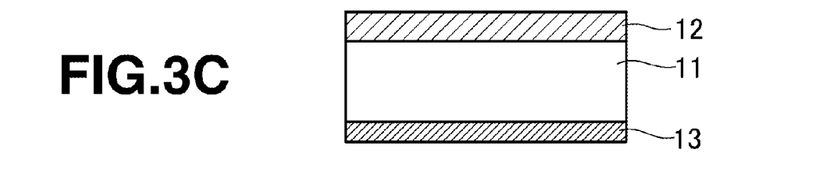
Figure 3D:
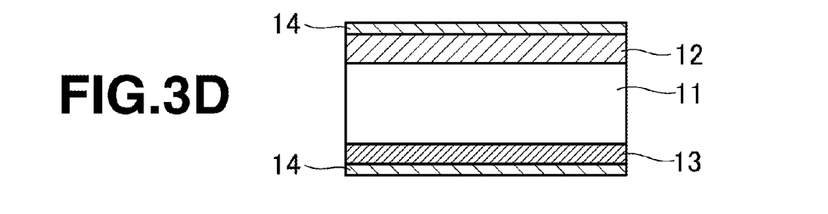
Figure 3E:
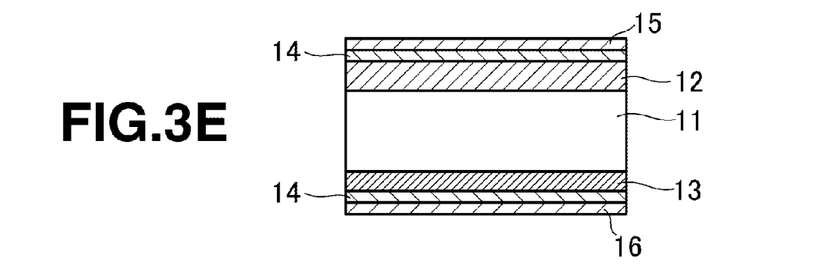
Figure 3F:
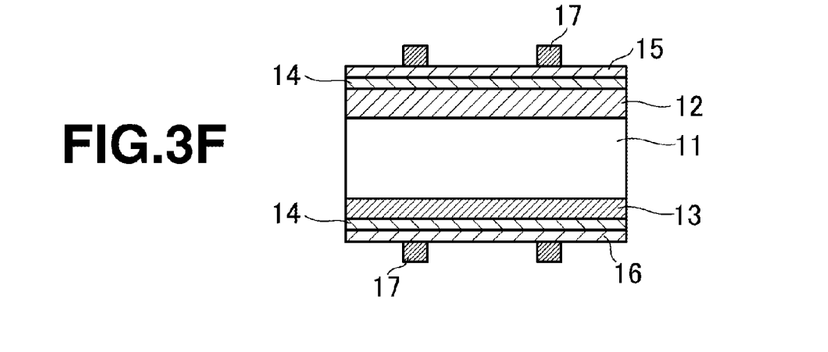
Figure 4A:
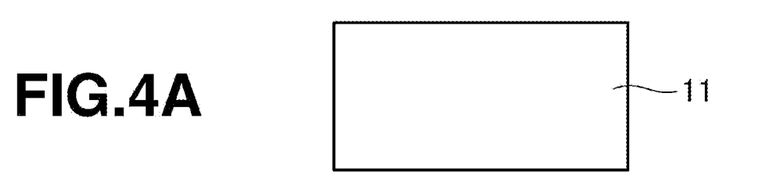

As shown in FIGS. 3 and 4, a silicon substrate 11 used herein as the semiconductor substrate may be of n- or p-type. FIG. 3(A) shows an n-type silicon substrate, whereas FIG. 4(A) shows a p-type silicon substrate. A single crystal silicon substrate may have been prepared by either of the Czochralski (CZ) method and the floating zone melting (FZ) method. It is preferred for the manufacture of solar cells with better performance that the silicon substrate 11 have a resistivity of 0.1 to 20 Ω·cm, more preferably 0.5 to 2.0 Ω·cm. The preferred silicon substrate 11 is a phosphorus-doped n-type single crystal silicon substrate since a relatively long lifetime is obtainable. For phosphorus doping, the dopant concentration is preferably $1 \times 10^{15}$ to $5 \times 10^{16}$ cm$^{-3}$.

(2) Damage Etching/Texturing

For example, the silicon substrate 11 is immersed in sodium hydroxide aqueous solution to remove any slice-damaged layer via etching. For damage removal from the substrate, strong alkali aqueous solutions such as potassium hydroxide may be used. The same purpose may also be achieved with acid aqueous solutions such as fluoronitric acid.

After the etching for damage removal, the substrate 11 is provided with a random texture. Most often the solar cell substrate is preferably provided with an irregular shape or texture at its surface (light-receiving surface). This is because at least two reflections must occur on the light-receiving surface in order to reduce the reflectivity in the visible spectrum. While the texture shape consists of peaks and valleys, each peak may have a size of about 1 to 20 μm. Typical surface texture structures are V and U trenches, which may be formed by a grinding tool. The random texture structure may also be prepared by wet etching involving immersing in an aqueous solution of sodium hydroxide with isopropyl alcohol added, acid etching, or reactive ion etching (RIE). It is noted that the texture structures formed on opposite surfaces are not depicted in FIGS. 3 and 4 because they are of microscopic size.

Figures 4B, 4C:
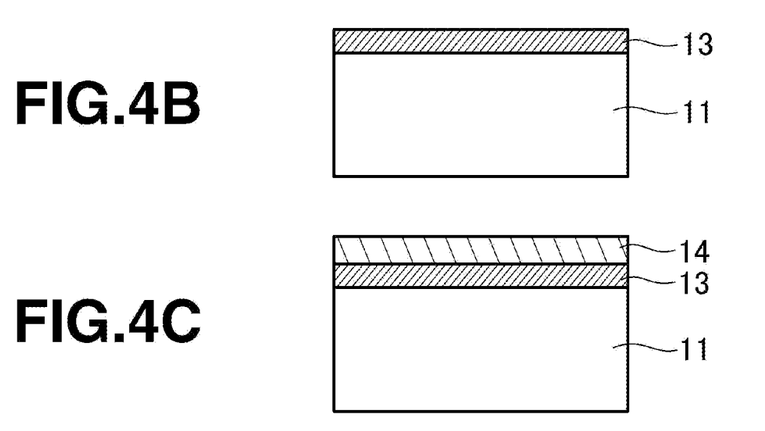

(3) Formation of n-Type Diffusion Layer

Where the silicon substrate 11 is of n-type as shown in FIG. 3, a coating agent containing a dopant is applied onto the back surface and heat treated to form an n-type diffusion layer 13 on at least a portion of the back surface, preferably on the entire back surface (FIG. 3(B)). Where the silicon substrate is of p-type as shown in FIG. 4, a coating agent containing a dopant is applied onto the light-receiving surface and heat treated to form an n-type diffusion layer 13 on the light-receiving surface (FIG. 4(B)). The dopant is preferably phosphorus. The surface dopant concentration of n-type diffusion layer 13 is preferably $1 \times 10^{18}$ to $5 \times 10^{20}$ cm$^{-3}$, more preferably $5 \times 10^{18}$ to $1 \times 10^{20}$ cm$^{-3}$.

After the heat treatment, any glass deposits on the silicon substrate 11 are cleaned away by glass etching or the like.

(4) Formation of p-Type Diffusion Layer

As shown in FIG. 3(C), treatment similar to the formation of n-type diffusion layer is carried out on the light-receiving surface to form a p-type diffusion layer 12 on the entire light-receiving surface. Alternatively, p-type diffusion layers 12 may be formed on the front surfaces by mating the n-type diffusion layer-bearing back surfaces together, and carrying out gas phase diffusion of BBr$_3$. The dopant is preferably boron. The surface dopant concentration of p-type diffusion layer 12 is preferably $1 \times 10^{18}$ to $5 \times 10^{20}$ cm$^{-3}$, more preferably $5 \times 10^{18}$ to $1 \times 10^{20}$ cm$^{-3}$.

(5) p-n Junction Isolation

Using a plasma etcher, p-n junction isolation is carried out. In this junction isolation, samples are stacked so as to prevent the plasma and radicals from invading the light-receiving surface and back surface, and the edge is ground several microns in the stacked state. After the junction isolation, any glass deposits and silicon debris on the substrate are cleaned away by glass etching or the like.

(6) Formation of Antireflective Film

Subsequently, a silicon nitride film 14 serving as antireflective film is formed on each of the front and back surfaces of the silicon substrate (FIG. 3(D)) or the light-receiving surface of the silicon substrate (FIG. 4(C)) in order to effectively transmit sunlight into the silicon substrate. The silicon nitride film also functions as a passivation film for the surface and interior of the silicon substrate. The method of forming the silicon nitride film is a plasma-enhanced CVD process using a remote plasma-enhanced CVD apparatus 100 shown in FIG. 5.

Figure 5:
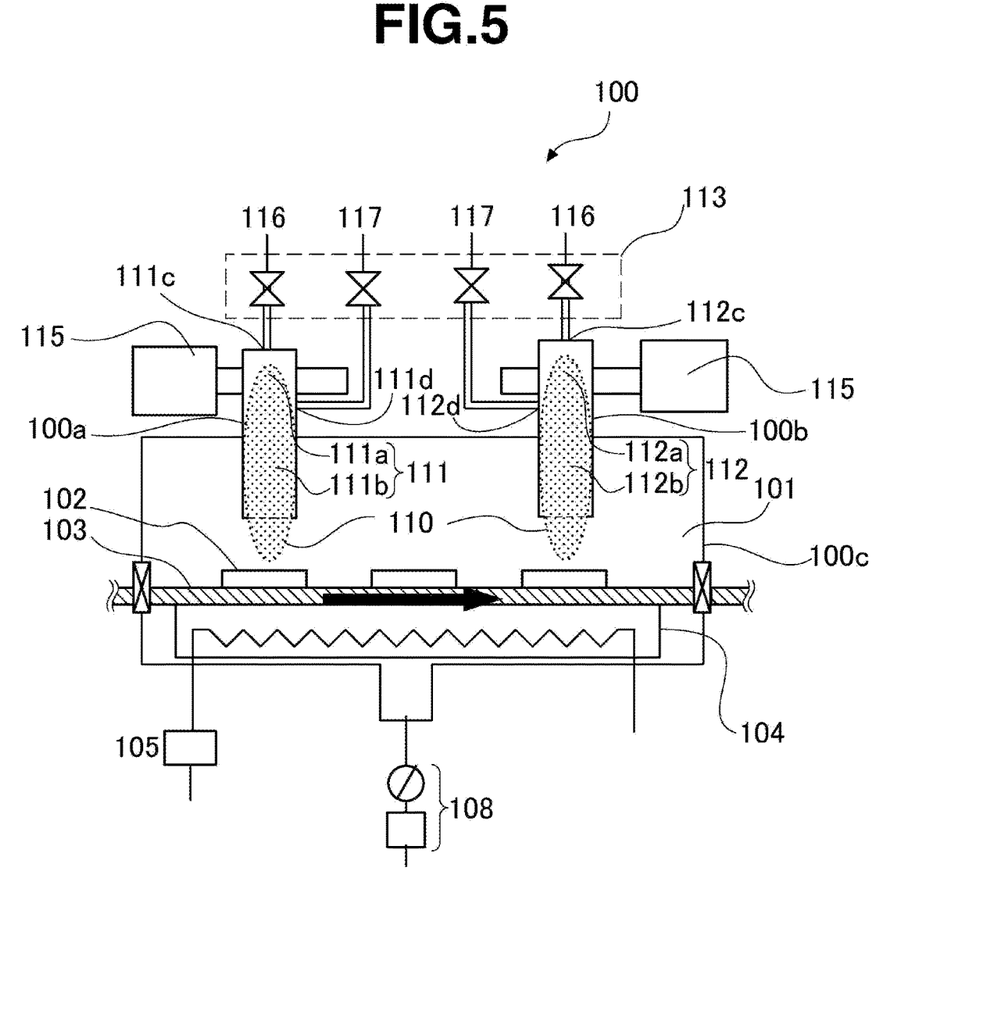
FIG. 5 is a schematic view illustrating one exemplary remote plasma-enhanced CVD apparatus used in the solar cell producing method of the invention.

As shown in FIG. 5, the remote plasma-enhanced CVD apparatus 100 used herein includes a vacuum chamber 100c defining a deposition compartment 101, two plasma diaphragms 100a, 100b defining two plasma compartments 111, 112 disposed above the vacuum chamber 100c in fluid communication with the deposition compartment 101, a pumping unit 108 for vacuum pumping the interior of vacuum chamber 100c, that is, deposition compartment 101, and a flow controller 113 for independently adjusting the ratio of flow rates of carrier gas 116 and reactant gas 117 for each of the plasma compartments 111, 112. It is noted that the plasma diaphragms 100a, 100b have auxiliary vacuum pumping units (not shown).

Disposed in the deposition compartment 101 are a tray 103 for supporting the semiconductor substrate 102 such that the substrate having completed treatments until the p-n junction isolation may be conveyed through the compartment and a heater block 104 for heating the semiconductor substrate 102 via the tray 103. The heater block 104 is connected to temperature control means 105 for controlling the heating temperature of the heater block 104.

Each of the plasma compartments 111, 112 is a cylindrical plasma-generating compartment consisting of an excitation section 111a, 112a for exciting a carrier gas 116 fed from upstream to plasma state to generate reactive species (or radicals), and an activation reaction section 111b, 112b disposed downstream of the excitation section 111a, 112a for introducing reactant gas 117 to the excited carrier gas 116 such that the reactive species may induce chemical reactions. The plasma compartments 111, 112 are arranged above the deposition compartment 101 in the order of 111 to 112 in the convey direction of semiconductor substrate 102, while the end opening of each plasma compartment is in fluid communication with the deposition compartment 101. The end openings of plasma compartments 111, 112 are positioned at such a close distance that material may be deposited on the semiconductor substrate 102, but spaced apart from the semiconductor substrate 102 such that the semiconductor substrate 102 may not be directly exposed to the plasma flow injected from the end opening or damaged by the plasma.

The excitation sections 111a, 112a are provided at their top with carrier gas inlet ports 111c, 112c for introducing carrier gas 116 therein. The excitation sections 111a, 112a are also provided at their side with microwave power supplies 115 for applying microwave of 2.45 GHz to the carrier gas introduced therein to generate electric discharge.

The activation reaction sections 111b, 112b are provided with reactant gas inlet ports 111d, 112d for introducing reactant gas 117 therein.

After a ratio of flow rates of carrier gas 116 and reactant gas 117 is adjusted independently for each of the plasma compartments 111, 112 by the flow controller 113, the carrier gas 116 and reactant gas 117 are introduced into the plasma compartments 111, 112. In the excitation sections 11a, 112a, microwave is irradiated from the microwave power supplies 115 to excite the carrier gas 116 (to plasma state), to form plasma regions 110. Then in the activation reaction sections 111b, 112b, the reactant gas 117 is introduced into the excited carrier gas 116 for activation. In the activation reaction sections 111b, 112b and transition zones from the activation reaction sections 111b, 112b to the deposition compartment 101, chemical reactions take place between carrier gas components and reactant gas components. Plasma flows are injected from the end openings of the plasma compartments 111 or 112 toward the semiconductor substrates 102 placed immediately below the openings. When the semiconductor substrate 102 is placed below the end opening of the plasma compartment 111, 112 in this state, a film corresponding to the composition of deposition gases, carrier gas 116 and reactant gas 117 is formed on the semiconductor substrate 102.

In the practice of the invention, of the deposition gases, ammonia ($NH_3$) is used as the carrier gas 116, and silane gas such as $SiH_4$, or $Si_2H_6$ is used as the reactant gas 117. Then a silicon nitride film is formed.

In this step, film-forming treatment is carried out in the following procedure. In the deposition compartment 101 of the remote plasma-enhanced CVD apparatus 100, the semiconductor substrate 102 is first rested on the tray 103, and the compartment is evacuated to vacuum by the pumping unit 108. Thereafter, the compartment is heated at the predetermined temperature, and ammonia gas as carrier gas 116 and silane gas as reactant gas 117 are introduced into each of the plasma compartments 111, 112 after a ratio of flow rates of deposition gases is adjusted independently for each of the plasma compartments 111, 112 by the flow controller 113, for thereby forming the plasma regions 110 as mentioned above. Next, while the semiconductor substrates 102 on the tray 103 are conveyed forward, a first silicon nitride layer is deposited on the semiconductor substrate 102 below the end opening of the first plasma compartment 111. Subsequently, the semiconductor substrate 102 is conveyed to below the end opening of the second plasma compartment 112 into which the carrier gas 116 (ammonia gas) and the reactant gas 117 (silane gas) are introduced in a different flow rate ratio than in the first plasma compartment 111, where a second silicon nitride layer having a different composition than the first silicon nitride layer is deposited on the first silicon nitride layer, yielding a silicon nitride film of two-layer structure.

The overall thickness of the silicon nitride film may be selected as appropriate depending on the reflectivity of the film and the surface morphology of the semiconductor substrate although the thickness is typically in the range of about 60 to 100 nm, preferably about 70 to 90 nm. The thickness of the first silicon nitride layer is preferably in the range of about 30 to 70 nm, more preferably about 35 to 55 nm. The thickness of the second silicon nitride layer is preferably in the range of about 30 to 70 nm, more preferably about 35 to 55 nm.

The deposition gas conditions (gas flow rates) in the first plasma compartment 111 may be determined as appropriate depending on the shape and size of the deposition compartment 101 and the convey speed of the semiconductor substrate 102. For example, provided that a silicon nitride film is deposited on the surface of a silicon substrate which is dimensioned 10 cm×10 cm to 15 cm×15 cm and continuously conveyed, it is preferred to feed 50 to 500 sccm of ammonia and 300 to 1,000 sccm of monosilane, more preferably 250 to 350 sccm of ammonia and 350 to 500 sccm of monosilane.

As for the deposition gas conditions (gas flow rates) in the second plasma compartment 112, it is preferred to feed 300 to 1,000 sccm of ammonia and 10 to 500 sccm of monosilane, more preferably 450 to 500 sccm of ammonia and 250 to 300 sccm of monosilane.

In either of the first and second plasma compartments 111 and 112, if the gas flow rates are lower than the ranges, a uniform silicon nitride layer may not be formed. If the gas flow rates are more than the ranges, the deposition gases may run to waste.

It is also preferred that a flow rate ratio of ammonia gas to silane gas (ammonia gas flow rate/silane gas flow rate) in the first plasma compartment 111 be lower than a flow rate ratio of ammonia gas to silane gas (ammonia gas flow rate/silane gas flow rate) in the second plasma compartment 112. Specifically, the flow rate ratio of ammonia gas to silane gas (ammonia gas flow rate/silane gas flow rate) in the first plasma compartment 111 is preferably from 0.1 to 1.0, more preferably from 0.5 to 0.8. If this flow rate ratio is less than 0.1, the resulting film may be inadequate as the antireflective film. If the flow rate ratio is more than 1.0, the effect of enhancing passivation may not be obtained. Also, the flow rate ratio of ammonia gas to silane gas (ammonia gas flow rate/silane gas flow rate) in the second plasma compartment 112 is preferably from 1.5 to 3.0, more preferably from 1.5 to 2.0. If this flow rate ratio is less than 1.5 or more than 3.0, the resulting film may be inadequate as the antireflective film.

Of other deposition conditions in the above-described embodiment, preferably the pressure in the deposition compartment 101 is 10 to 100 Pa, the temperature of the semiconductor substrate 102 is 250 to 600° C., and the convey speed of the tray 103, which varies with the flow rates and flow rate ratio of deposition gases, is 90 to 150 cm/min when the overall thickness of the silicon nitride film being deposited is 60 to 100 nm.

As described above, as long as a silicon nitride film of two-layer structure is formed under the above-specified deposition conditions using the remote plasma-enhanced CVD apparatus of FIG. 5, a silicon nitride film having improved passivation effect may be formed in a consistent manner.

(7) Formation of Electrodes

Figure 4D:
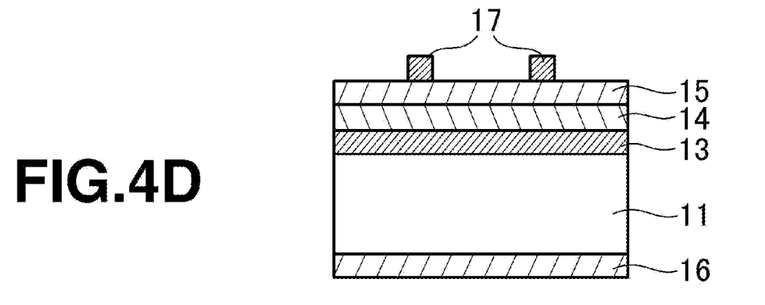

Using a screen printing machine or the like, on the light-receiving surface and back surface sides, a paste containing silver, for example, is printed onto the p-type diffusion layer 12 and n-type diffusion layer 13, i.e., coated in interdigital electrode patterns and dried to form a finger electrode 15 and a back electrode 16 (FIG. 3(E) or FIG. 4(D)). Particularly when the silicon substrate used is of p type, preferably a paste obtained by mixing aluminum (Al) powder in an organic binder is screen printed on the back surface side and dried to form a back electrode 16. Next, on both the light-receiving surface and back surface (FIG. 3(F)) or on the light-receiving surface (FIG. 4(D)), a bus bar electrode 17 is formed from a silver paste or the like by screen printing. Finally, firing is carried out at 500 to 900° C. for 1 to 30 minutes in a firing furnace, completing the finger electrode 15, back electrode 16 and bus bar electrode 17 in electrical contact with the p-type diffusion layer 12 or n-type diffusion layer 13. Although FIG. 3(F) is depicted as if the finger electrode 15 and back surface 16 are not in contact with the diffusion layers 12, 13, and FIG. 4(D) is depicted as if the finger electrode 15 is not in contact with the diffusion layer 13, in fact, the electrodes are in electrical contact with the diffusion layers as a result of fire-through upon firing.

EXAMPLES

Examples and Comparative Examples are given below for further illustrating the invention although the invention is not limited thereto.

Example 1

As shown in FIG. 3, a phosphor-doped n-type single crystal silicon substrate 11 of crystal face orientation (100), 15.65 cm squares, 200 μm thick, and as-sliced resistivity 2 Ω·cm (dopant concentration $7.2 \times 10^{15}$ cm$^{-3}$) was immersed in sodium hydroxide aqueous solution where the damaged layer was removed by etching, then immersed in potassium hydroxide aqueous solution having isopropyl alcohol added thereto, where the substrate was textured by alkali etching (FIG. 3(A)).

A coating agent containing phosphorus dopant was coated onto the back surface of the silicon substrate 11 and heat treated at 900° C. for 1 hour to form an n-type diffusion layer 13 on the back surface (FIG. 3(B)). After the heat treatment, glass deposits on the substrate were removed in a conc. hydrofluoric acid solution or the like, and the substrate was cleaned.

Subsequently, two silicon substrates 11 having n-type diffusion layer 13 formed were stacked with their back surfaces mated, followed by gas phase diffusion of BBr$_3$ to form a p-type diffusion layer 12 on the entire light-receiving surface (FIG. 3(C)).

Next, p-n junction isolation was carried out using a plasma etcher. With the substrates kept stacked so as to prevent any plasma or radicals from invading the light-receiving surface and back surface, the end face was etched several microns. Thereafter, glass deposits on the substrate were removed in a conc. hydrofluoric acid solution or the like, and the substrate was cleaned.

Subsequently, by using a remote plasma-enhanced CVD apparatus (model SiNA1000 by Roth & Rau) constructed as shown in FIG. 5, feeding ammonia as the carrier gas 116 and monosilane (SiH$_4$) as the reactant gas 117, and setting a flow rate ratio of ammonia gas to monosilane gas (ammonia gas flow rate (sccm)/monosilane gas flow rate (sccm)) in the first plasma compartment 111 to be 0.5, and a flow rate ratio of ammonia gas to monosilane gas (ammonia gas flow rate (sccm)/monosilane gas flow rate (sccm)) in the second plasma compartment 112 to be 2.0, by means of the flow controller 113, a silicon nitride film 14 of two-layer structure as a dielectric film was deposited on each of the p-type diffusion layer 12 on the light-receiving surface side and the n-type diffusion layer 13 on the back surface side (FIG. 3(D)). Each of the silicon nitride films had a thickness of 70 nm.

Finally, a silver paste was printed on the light-receiving surface and back surface sides, dried, and fired at 750° C. for 3 minutes, to form the finger electrode 15, back electrode 16 and bus bar electrode 17 (FIGS. 3(E) and (F)).

Example 2

As shown in FIG. 4, a p-type single crystal silicon substrate as in Example 1 was used as the silicon substrate 11 and as in Example 1, immersed in sodium hydroxide aqueous solution where the damaged layer was removed by etching, then immersed in potassium hydroxide aqueous solution having isopropyl alcohol added thereto where the substrate was textured by alkali etching (FIG. 4(A)).

A coating agent containing phosphorus dopant was coated onto the light-receiving surface of the silicon substrate 11 and heat treated at 800° C. for 1 hour to form an n-type diffusion layer 13 on the surface (FIG. 4(B)). After the heat treatment, glass deposits on the substrate were removed in a conc. hydrofluoric acid solution or the like, and the substrate was cleaned.

Subsequently, by using a remote plasma-enhanced CVD apparatus (model SiNA1000 by Roth & Rau) constructed as shown in FIG. 5, feeding ammonia as the carrier gas 116 and monosilane (SiH$_4$) as the reactant gas 117, and setting a flow rate ratio of ammonia gas to monosilane gas (ammonia gas flow rate (sccm)/monosilane gas flow rate (sccm)) in the first plasma compartment 111 to be 0.5, and a flow rate ratio of ammonia gas to monosilane gas (ammonia gas flow rate (sccm)/monosilane gas flow rate (sccm)) in the second plasma compartment 112 to be 2.0, by means of the flow controller 113, a silicon nitride film 14 of two-layer structure as a dielectric film was deposited on the n-type diffusion layer 13 on the light-receiving surface side (FIG. 4(C)). The film had a thickness of 80 nm.

Subsequently, silver paste and aluminum paste were printed on the light-receiving surface and back surface sides, respectively, dried, and fired at 750° C. for 3 minutes, to form the finger electrode 15, back electrode 16 and bus bar electrode 17 (FIG. 4(D)).

Comparative Example 1

A solar cell was manufactured under the same conditions as in Example 1 except that using the direct plasma-enhanced CVD apparatus shown in FIG. 1 instead of the remote plasma-enhanced CVD apparatus 100, silicon nitride films of 70 nm thick were formed on the p-type diffusion layer 12 on the light-receiving surface side and the n-type diffusion layer 13 on the back surface side.

Comparative Example 2

A solar cell was manufactured under the same conditions as in Example 2 except that using the direct plasma-enhanced CVD apparatus shown in FIG. 1 instead of the remote plasma-enhanced CVD apparatus 100, a silicon nitride film of 80 nm thick was formed on the n-type diffusion layer 13 on the light-receiving surface side.

For the solar cells obtained in Examples 1, 2 and Comparative Examples 1, 2, current-voltage characteristics were measured using a solar simulator (light intensity 1 kW/m$^2$, spectrum AM1.5 global). The results are shown in Table 1. It is noted that the value in Table 1 is an average of 10 cells manufactured in each of Examples 1, 2 and Comparative Examples 1, 2.

TABLE 1

| | Open-circuit voltage (mV) | Short-circuit current (mA/cm$^2$) | Fill factor (%) | Conversion efficiency (%) |
| --- | --- | --- | --- | --- |
| Example 1 | 648 | 38.9 | 79.2 | 19.9 |
| Comparative Example 1 | 645 | 38.3 | 79.0 | 19.5 |
| Example 2 | 637 | 36.6 | 79.0 | 18.4 |
| Comparative Example 2 | 632 | 36.1 | 79.0 | 18.0 |

In Examples 1 and 2, using the remote plasma-enhanced CVD apparatus of FIG. 5, a film is continuously deposited in the state that the flow rate ratio of ammonia gas to silane gas is fixed in each of two plasma compartments. Thus a silicon nitride film rich in positive fixed charge is formed on the silicon substrate front surface side. Thus a silicon nitride film having improved passivation effect and increased productivity is formed in a consistent manner. The cells display higher conversion efficiency than Comparative Examples 1 and 2.

Although the invention is illustrated with reference to the embodiments shown in the drawings, the invention is not limited to the embodiments shown in the drawings. Other embodiments, addition, change, deletion or the like may occur to the skilled artisan. All such embodiments are included within the scope of the invention as long as the effects and results of the invention are achievable.

REFERENCE SIGNS LIST

1, 101 deposition compartment
2, 102 semiconductor substrate
3, 103 tray
4, 104 heater block
5, 105 temperature control means
6 deposition gas inlet line
7 radio-frequency power supply
8, 108 pumping unit
10 CVD apparatus
10c, 100c vacuum chamber
11 silicon substrate (n- or p-type)
12 p-type diffusion layer
13 n-type diffusion layer
14 antireflective film (silicon nitride film)
15 finger electrode
16 back electrode
17 bus bar electrode
91, 116 carrier gas
92 auxiliary pumping line
93 excitation compartment
93a, 111c, 112c carrier gas inlet port
93b auxiliary pumping port
93c radio-frequency introducing means
94 matching unit
95, 115 microwave power supply
96, 110 plasma region
97, 117 reactant gas
98 reaction compartment
98a main pumping port
99 substrate holder
99a substrate
100 remote plasma-enhanced CVD apparatus
100a, 100b plasma diaphragm
111, 112 plasma compartment
111a, 112a excitation section
111b, 112b activation reaction section
111d, 112d reactant gas inlet port
113 flow controller

The invention claimed is:

1. A method for producing a solar cell having an antireflective film constructed of a first silicon nitride layer and a second silicon nitride layer having a composition different from the first silicon nitride layer on a surface of a semiconductor substrate, the method comprising:
   providing a remote plasma-enhanced CVD apparatus including
      a deposition compartment, and
      a first plasma compartment and a second plasma compartment each disposed above the deposition compartment in fluid communication with the deposition compartment,
   placing a substrate below a first plasma compartment in the deposition compartment,
   depositing a first silicon nitride layer on the semiconductor substrate from a first plasma flow from a first plasma compartment by generating a plasma flow of ammonia gas, introducing silane gas into the plasma flow and injecting the plasma flow toward the deposition compartment,
   conveying the substrate to below the second plasma compartment, and
   depositing a second silicon nitride layer of a different composition than the first silicon nitride layer from a second plasma flow from a second plasma compartment by generating a plasma flow of ammonia gas, introducing silane gas into the plasma flow and injecting the plasma flow toward the deposition compartment, the second plasma compartment having a different flow rate ratio of ammonia gas to silane gas than in the first plasma compartment, wherein each of the first and second plasma compartments is a cylindrical plasma-generating compartment comprising an excitation section for generating the plasma flow of ammonia gas fed from upstream and an activation reaction section disposed downstream of the excitation section for introducing silane gas into the plasma flow, and has end opening which is in fluid communication with the deposition compartment and injects the plasma flow toward the substrate placed below the end opening.

2. The solar cell production method of claim 1 wherein the flow rate ratio of ammonia gas to silane gas (ammonia gas flow rate/silane gas flow rate) in the first plasma compartment is 0.1 to 1.0.

3. The solar cell production method of claim 2 wherein the flow rate ratio of ammonia gas to silane gas (ammonia gas flow rate/silane gas flow rate) in the second plasma compartment is 1.5 to 3.0.

4. The solar cell production method of claim 1 wherein the semiconductor substrate is a silicon substrate of one conductivity type having a diffusion layer of opposite conductivity type formed on a substrate surface that is assigned to a light-receiving surface, and the antireflective film is formed on the diffusion layer.

5. The solar cell production method of claim 1 wherein the semiconductor substrate is a silicon substrate of one conductivity type having a diffusion layer of one conductivity type formed on at least a portion of a substrate surface that is assigned to a surface remote from a light-receiving surface, and the antireflective film is formed on the diffusion layer-bearing surface.

6. The solar cell production method of claim 2 wherein the semiconductor substrate is a silicon substrate of one conductivity type having a diffusion layer of opposite conductivity type formed on a substrate surface that is assigned to a light-receiving surface, and the antireflective film is formed on the diffusion layer.

7. The solar cell production method of claim 3 wherein the semiconductor substrate is a silicon substrate of one conductivity type having a diffusion layer of opposite conductivity type formed on a substrate surface that is assigned to a light-receiving surface, and the antireflective film is formed on the diffusion layer.

8. The solar cell production method of claim 2 wherein the semiconductor substrate is a silicon substrate of one conductivity type having a diffusion layer of one conductivity type formed on at least a portion of a substrate surface that is assigned to a surface remote from a light-receiving surface, and the antireflective film is formed on the diffusion layer-bearing surface.

9. The solar cell production method of claim 3 wherein the semiconductor substrate is a silicon substrate of one conductivity type having a diffusion layer of one conductivity type formed on at least a portion of a substrate surface that is assigned to a surface remote from a light-receiving surface, and the antireflective film is formed on the diffusion layer-bearing surface.

10. The solar cell production method of claim 4 wherein the semiconductor substrate is a silicon substrate of one conductivity type having a diffusion layer of one conductivity type formed on at least a portion of a substrate surface that is assigned to a surface remote from a light-receiving surface, and the antireflective film is formed on the diffusion layer-bearing surface.

11. The solar cell production method of claim 1 wherein the end openings of the first and second plasma compartments are spaced apart from the substrate placed below the end opening such that the substrate is not directly exposed to the plasma flow injected from the end opening.

* * * * *